United States Patent

Shin

[11] Patent Number: 5,863,833
[45] Date of Patent: Jan. 26, 1999

[54] METHOD FOR FORMING SIDE CONTACT IN A SEMICONDUCTOR DEVICE

[75] Inventor: Heon-jong Shin, Seoul, Rep. of Korea

[73] Assignee: Samsung Electronics Co., Ltd., Kyungki-do, Rep. of Korea

[21] Appl. No.: 540,784

[22] Filed: Oct. 11, 1995

[30] Foreign Application Priority Data

Dec. 14, 1994 [KR] Rep. of Korea .................. 1994-34249

[51] Int. Cl.$^6$ .............................................. H01L 21/4763
[52] U.S. Cl. ........................ 438/624; 438/625; 438/635; 438/648
[58] Field of Search ..................... 438/624, 625, 438/635, 648, 426, 361, 430, 432, 452, 618

[56] References Cited

U.S. PATENT DOCUMENTS

| | | | |
|---|---|---|---|
| 4,866,009 | 9/1989 | Matsuda | 437/203 |
| 4,874,719 | 10/1989 | Kurosawa | 438/625 |
| 4,900,695 | 2/1990 | Takahashi et al. | 438/625 |
| 5,204,286 | 4/1993 | Doan | 438/624 |
| 5,210,053 | 5/1993 | Yamagata | 438/624 |
| 5,304,510 | 4/1994 | Suguro et al. | 438/624 |
| 5,422,294 | 6/1995 | Noble, Jr. | 438/386 |
| 5,500,544 | 3/1996 | Park et al. | 438/635 |
| 5,554,565 | 9/1996 | Lian et al. | 438/624 |
| 5,571,751 | 11/1996 | Chung | 438/625 |
| 5,578,518 | 11/1996 | Koike et al. | 438/426 |
| 5,593,921 | 1/1997 | Chen et al. | 438/624 |

*Primary Examiner*—Charles L. Bowers, Jr.
*Assistant Examiner*—Lynne A. Gurley
*Attorney, Agent, or Firm*—Myers Bigel Sibley & Sajovec

[57] ABSTRACT

A method of forming a side contact in a semiconductor device wherein a first insulating layer, first conductive and second insulating layer are formed over a substrate, and a contact hole through these layers exposes a portion of the substrate and a side edge of the first conductive layer. A refractory metal layer being formed in the contact hole, such that the natural oxide layer is changed into a conductive material by reaction with the refractory metal layer during a subsequent process step.

11 Claims, 5 Drawing Sheets

METHOD FOR FORMING SIDE CONTACT IN A SEMICONDUCTOR DEVICE

BACKGROUND OF THE INVENTION

The present invention relates to a method for forming a side contact in a semiconductor device, and more particularly, to the method for forming a side contact in a semiconductor device having reduced contact resistance by exchange of the natural oxide film on the side contact with a conductive material.

In general, as supply voltages for semiconductor memory devices decrease with reductions in the devices' dimensions, memory cell stability during read/write operations has become an increasingly important issue in the development of high capacity, semiconductor memory devices, such as the static random access memory (SRAM). For 16 Mb SRAMs, a symmetrically split word line cell has been proposed which prevents degradation of cell stability. In the split word line cell structure, each cell has two word lines. Thus, a very tight bit line pitch is required. This creates problems in reducing the cell size and in obtaining higher speed operation. In order to overcome these problems, a center word line cell structure having the word lines located in the center of each cell has been proposed. See, for example, *IEDM* '93 at pages 817 through 820.

FIGS. 1–3 show the various layouts adapted for use with a conventional center word line cell. More specifically, FIG. 1 is the layout of a bulk transistor. FIGS. 2 and 3 are respectively layouts of a thin-film transistor (TFT), and a capacitor. Within these FIGS., reference numeral 1 denotes an active layer; 3, a first polysilicon layer for a word line and driving transistor; 5, a TFT gate electrode; 7, a TFT channel; 9, a self-aligned contact; 11, a capacitor electrode; 13, a ground plate; and 15, a side contact.

The above center word line cell has a symmetrical layout with word line (first polysilicon layer) 3 being located in the center of the cell. This cell structure saves space when compared to the additional word line used in the split word line cell. As such, cell size can be reduced while preserving sufficient space for the required bit-line pitch.

FIG. 4 is a cross-sectional view of the above center word line cell. Basically, the center word line cell is made of five layers of polysilicon placed over impurity regions 18 formed in a substrate 17. The five polysilicon layers consist of first polysilicon patterns 19a, 19b and 19c forming an access transistor, and a drive transistor; a second polysilicon layer 21 used as a load TFT gate electrode on the center of the cell; a third polysilicon layer 23 as a TFT channel; a fourth polysilicon layer 25 used as a capacitor electrode; and, a fifth polysilicon layer 27 used as a ground plate. Reference numeral 31 donates a bit line.

The center word line cell uses a side contact, shown in area "AA" of FIG. 4. First polysilicon plug 29a is commonly connected to first, second, third and fourth polysilicon layers 19a, 21, 23 and 25. In particular, first polysilicon plug 29a is connected at its side to second and third polysilicon layers 21 and 23. Second polysilicon plug 29b is also connected between ground plate 27 and impurity region 18 in substrate 17.

The noted side contact will now be explained in greater detail with reference to FIG. 5 which is a cross-sectional view of a conventional side contact. Here, an impurity region 42 has been selectively formed in substrate 41. First insulating layer 43, first conductive layer (polysilicon layer) 45, and second insulating layer 47 are each sequentially formed over substrate 41 with a contact hole through each layer to expose impurity region 42. Second conductive layer (polysilicon plug) 49 fills the contact hole to form the side contact structure.

In the foregoing structure of the conventional side contact, natural oxide layer 44 forms on the side edge of first conductive layer 45. The formation of natural oxide layer 44 increases the contact resistance between polysilicon plug 49 and first conductive layer 45. In extreme cases where contact resistance increases to unacceptable levels, electrical connection may ultimately prove impossible.

SUMMARY OF THE INVENTION

The present invention provide a method of forming a side contact in a semiconductor device having reduced contact resistance. To achieve the result the present invention provides in one aspect a method for forming a side contact in a semiconductor device comprising the steps of; forming a first insulating layer over a substrate, forming a first conductive layer over the first insulating layer, forming second insulating layer over the first conductive layer, forming a contact hole through the second insulating layer, first conductive layer, and first insulating layer to expose a portion of the substrate, wherein a side edge of the first conductive layer is exposed in the contact hole, such that a natural oxide layer forms on the side edge upon exposure of the side edge to air, forming a refractory metal layer in the contact hole over the exposed portion of the substrate and over the natural oxide layer, forming a second conductive layer over the refractory metal layer to fill the contact hole, and changing the natural oxide layer into a conductive material.

In another aspect the present invention provides a method of forming a side contact in a semiconductor device comprising the steps of; forming a first insulating layer over a substrate, forming a first conductive layer over the first insulating layer, forming second insulating layer over the first conductive layer, forming a contact hole through the second insulating layer, first conductive layer, and first insulating layer to expose a portion of the substrate, wherein a side edge of the first conductive layer is exposed in the contact hole, such that a natural oxide layer forms on the side edge upon exposure of the side edge to air, forming a refractory metal layer in the contact hole over the exposed portion of the substrate and over the natural oxide layer, forming a diffusion inhibiting layer over the refractory metal layer, forming a second conductive layer over the diffusion inhibiting layer to fill the contact hole, and changing the natural oxide layer into a conductive material.

Within these aspects, the refractory metal layer is formed using a transition metal with a high oxygen solubility, for example, titanium, and the step of changing the natural oxide layer into a conductive material is performed by the reaction of the natural oxide layer and the refractory metal layer. The diffusion preventing layer are formed using titanium and titanium nitride, respectively.

BRIEF DESCRIPTION OF THE DRAWINGS

The benefits and advantages of the present invention will be readily apparent upon consideration of several preferred embodiments with reference to the attached drawings in which.

DETAILED DESCRIPTION OF THE INVENTION

First, the structure of a side contact according to the present invention will be explained with reference to FIG. 6 which is a cross-sectional view of the side contact.

Figure 6:
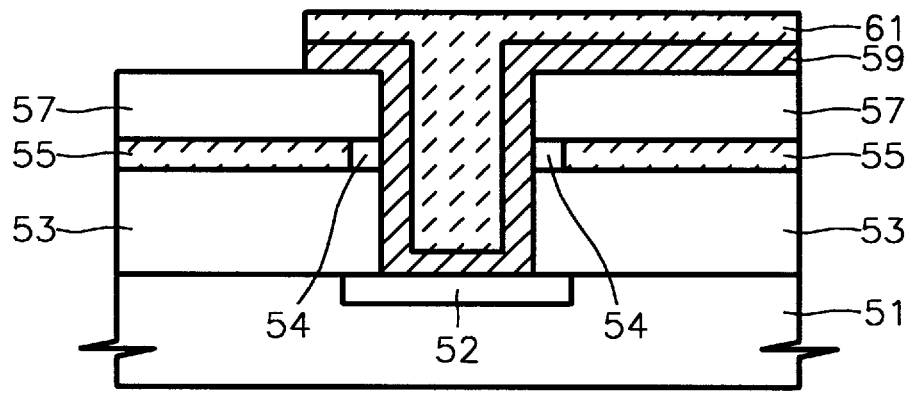
FIG. 6 is a cross-sectional view of a side contact according to a first embodiment of the present invention.

As shown in FIG. 6, an impurity region 52 is selectively formed on substrate 51. First insulating layer 53, first conductive layers 55 and second insulating layer 57 are formed over substrate 51 with a contact hole formed through these layers to expose impurity region 52. A refractory metal layer 59 is formed in the contact hole such that it overlays a portion of substrate 51 exposed through he contact hole. A second conductive layer (polysilicon plug) 61 is then applied to fill the contact hole.

In the foregoing side contact structure made according to the present invention, the oxide layer naturally forming on the side edge of first conductive layer 55 reacts with refractory metal layer 59 in succeeding process steps, and through this reactive process is changed into a conductive material 54. When compared with side contact structures which retain the natural oxide layer, the present invention enjoys reduced contact resistance between first conductive layer 55, which corresponds to the TFT channel shown in FIG. 4, and second conductive layer (polysilicon plug in FIG. 4) 61.

Figure 7:
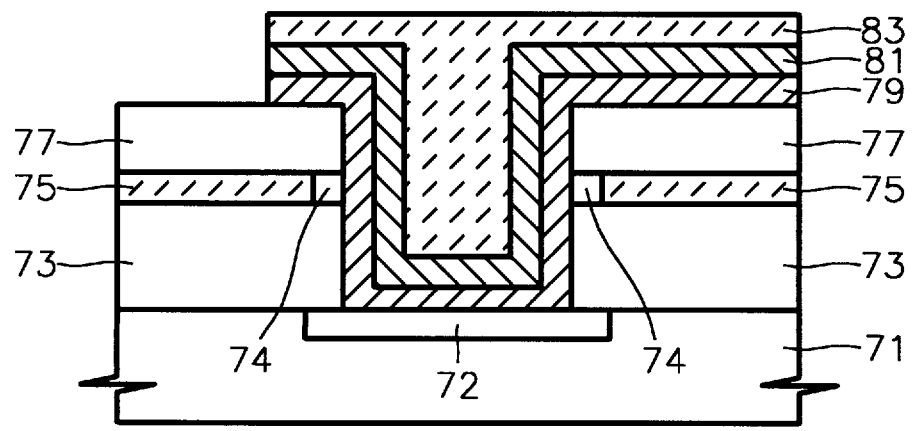
FIG. 7 is a cross-sectional view of a side contact according to a second embodiment of the present invention.

FIG. 7 is a cross-sectional view of a side contact structure formed according to another embodiment of the present invention. As shown in FIG. 7, an impurity region 72 is selectively formed on substrate 71. First insulating layer 73, first conductive layer 75 and second insulating layers 77 are formed over substrate 71 with a contact hole through each respective layer to expose impurity region 72. A refractory metal layer 79 is formed in the contact hole and over the exposed substrate portion 71. Additionally, a diffusion inhibiting layer 81 is formed over refractory metal layer 79, and a second conductive layer 83 filling the contact hole is formed over inhibiting preventing layer 81.

Figure 1:
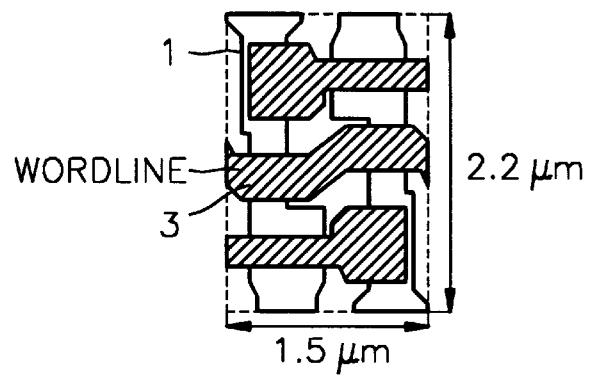
FIGS. 1–3 are the layouts of a conventional center word line cell according to prior art.
Figure 2:
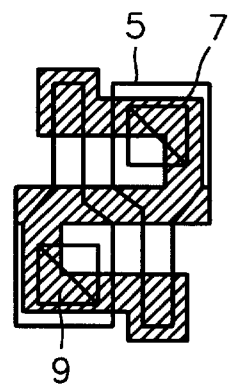
Figure 3:
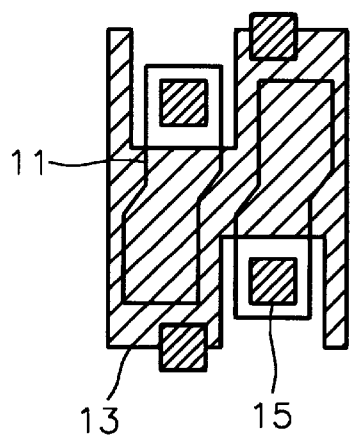
Figure 4:
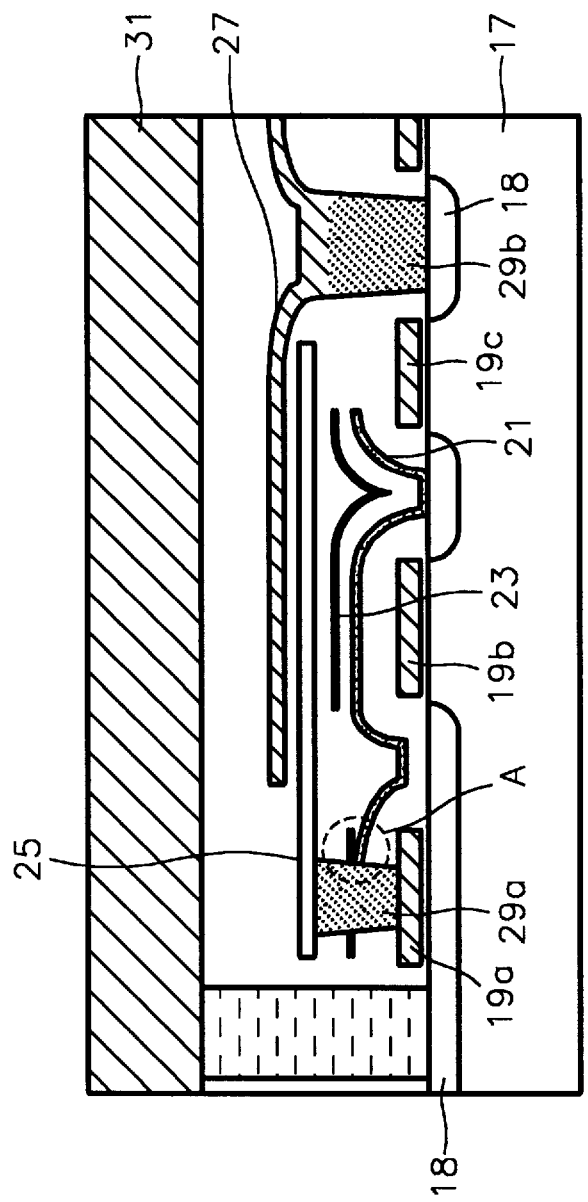
FIG. 4 is a cross-sectional view of a conventional center word line cell.
Figure 5:
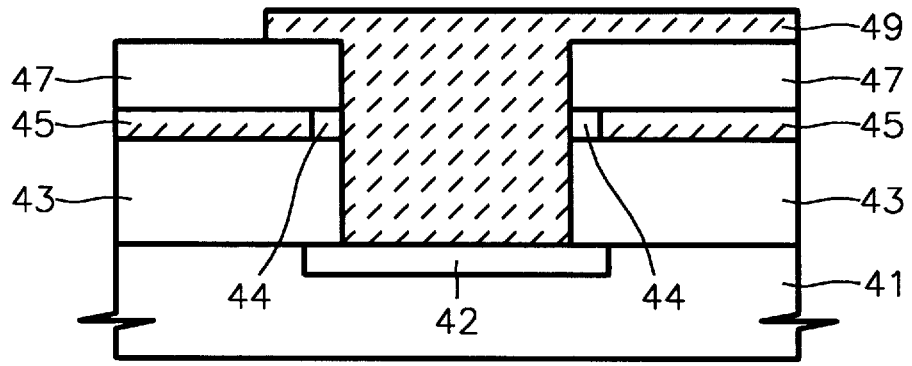
FIG. 5 is a cross-sectional view of a conventional side contact.

In the side contact structure according to the second embodiment of the present invention, the oxide layer naturally forming on the side edge of first conductive layer 75 reacts with refractory metal layer 79 in succeeding process steps, and through this reactive process changes into conductive material 85, thereby reducing a contact resistance between first conductive layer 75, the TFT channel in FIG. 4, and second conductive layer 83, the polysilicon plug in FIG. 4. The refractory metal layer is preferably formed of a transition metal having high oxygen solubility.

The manufacturing method for the foregoing side contact structures will now be described in detail.

FIGS. 8–11 are cross-sectional views illustrating an exemplary method for forming a side contact structure according to a first embodiment of the present invention.

Figure 8:
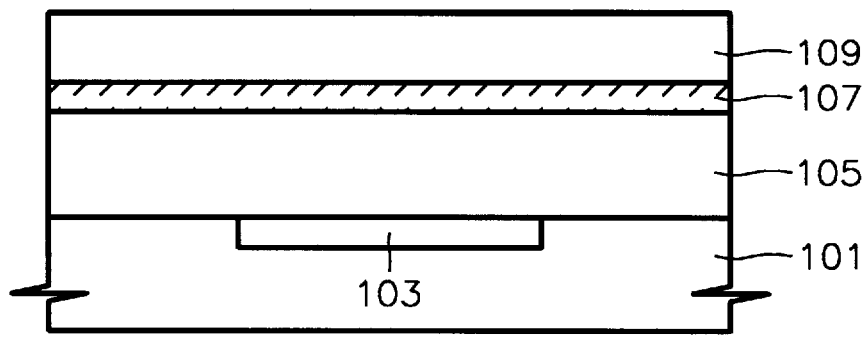
FIGS. 8–11 are cross-sectional views illustrating a method for forming a side contact according to the first embodiment of the present invention; and, FIGS. 12 and 13 are cross-sectional views illustrating a method for forming a side contact according to the second embodiment of the present invention.

FIG. 8 shows the steps of forming a first insulating layer 105, a first conductive layer 107 and a second insulating layer 109. More specifically, after selectively forming an impurity region 103 in the surface of a substrate 101, first insulating layer 105 comprising, for example, an oxide layer is formed over substrate 101. First conductive layer 107 comprising, for example, a polysilicon layer, is formed over first insulating layer 105. Then, a second insulating layer 109 comprising, for example, an oxide layer, is formed over first conductive layer 107.

Figure 9:
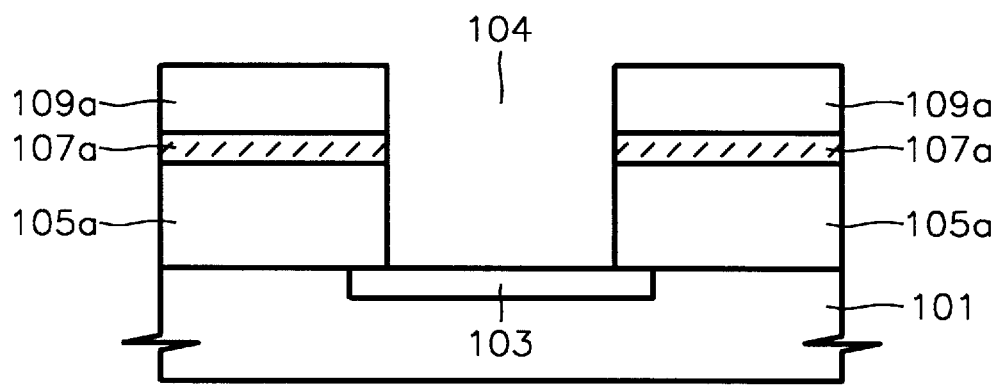

FIG. 9 shows a step of forming a contact hole 104. More specifically, second insulating layer 109, first conductive layer 107, and second insulating layer 105 are sequentially etched to form second insulating layer 109a, first conductive layer 107a and first insulating layer 105a, each having a contact hole 104 formed therein to expose impurity region 103.

Figure 10:
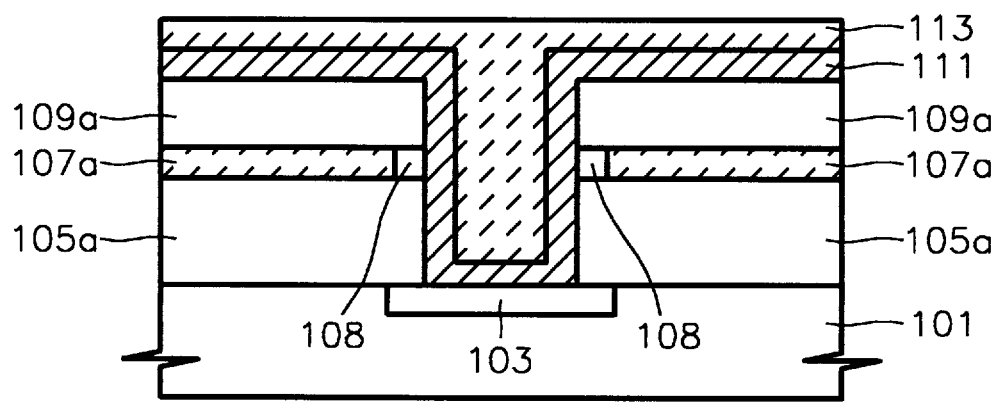

FIG. 10 shows a steps of forming a refractory metal layer 111, and a second conductive layer 113. First it should be noted that, oxide layer 108 naturally forms on the side edge of first conductive layer 107a when the foregoing structure is exposed air during the fabrication steps discussed above. Such air exposure happens as a matter of course, between process steps. Refractory metal layer 111 comprising, for example, a titanium layer is formed over the sidewalls of contact hole 104 to cover the exposed edges of second insulating layer 109a, naturally formed oxide layer 108, first insulating layer 105a, and the exposed portion of substrate 101. Next, second conductive layer 113 comprising, for example, a polysilicon layer, is formed over refractory metal layer 111 to fill contact hole 104. Second conductive layer 113 can be formed using a composite material including a polysilicon layer and a tungsten layer.

Figure 11:
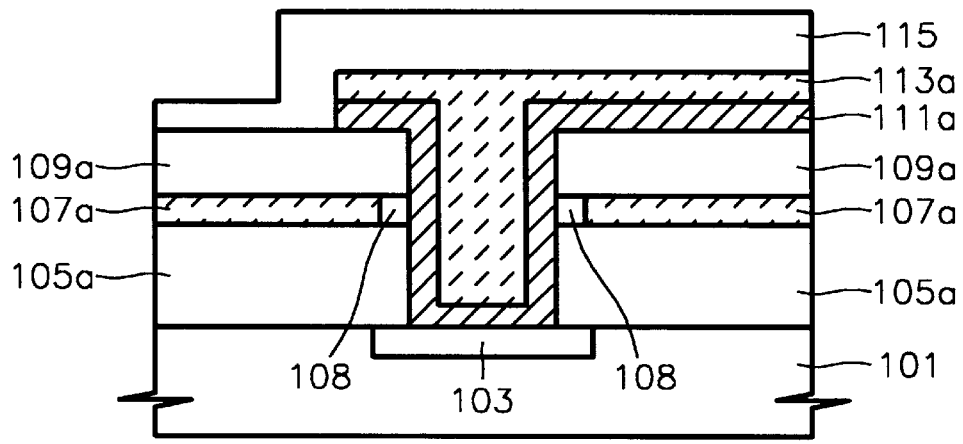

FIG. 11 shows a step of forming third insulating layer 115. More specifically, after forming second conductive layer 113a and refractory metal layer 111a patterned through a photolithography, third insulating layer 115 for insulating the second conductive layer is formed on the overall surface of the resultant structure.

After formation of a third insulating layer 115, naturally formed oxide layer 108 reacts with the overlaying refractory metal layer 111a to change into a conductive material such as $TiSi_xO_y$ during a succeeding process step, such as during a reflow process of a BPSG layer (not shown) used for planarization prior to deposition of a subsequently applied metal layer.

Figure 12:
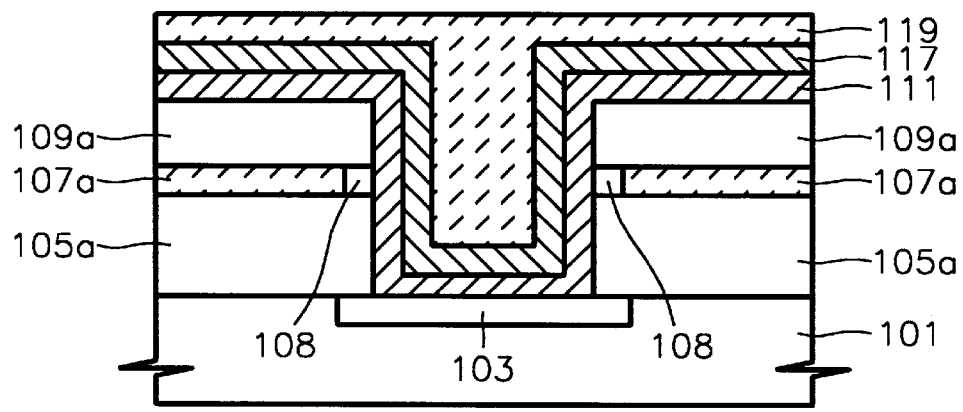
Figure 13:
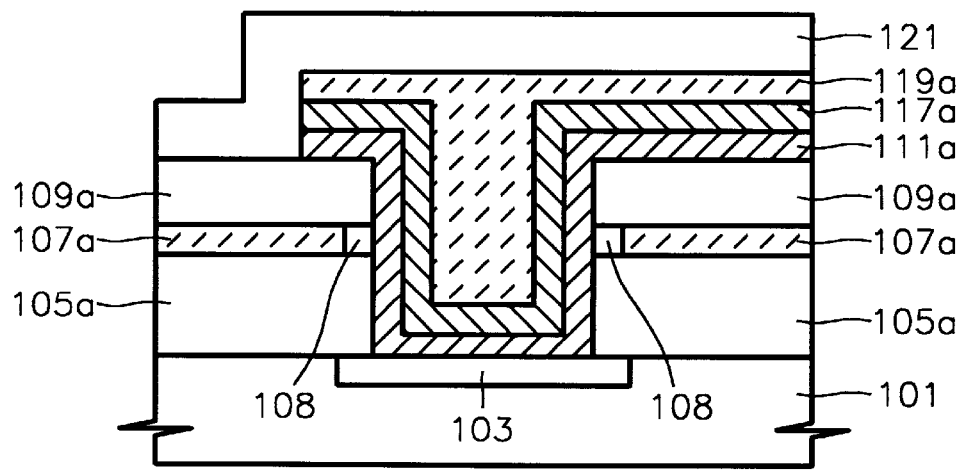

FIGS. 12 and 13 are cross-sectional views illustrating a method for forming a side contact structure according to a second embodiment of the present invention. In this embodiment, the first two steps, i.e., the steps shown in FIGS. 8 and 9, are the same as those in the first embodiment. In FIGS. 12 and 13, reference numerals used in previous FIGS. denote similar elements.

FIG. 12 shows a step of forming the refractory metal layer 111, a diffusion inhibiting layer 117, and a second conductive layer 119. As previously discussed, natural oxide layer 108 is formed on the side edge of first conductive layer 107a when the side contact structure is exposed to air during fabrication. Refractory metal layer 111 comprising, for example, a titanium layer, is formed over the sidewalls and bottom of the contact hole to cover second insulating layer 109a, natural oxide layer 108, first insulating layer 105a, and the exposed portion of substrate 101. Next, diffusion inhibiting layer 117 comprising, for example, a titanium nitride layer is formed over refractory metal layer 111. Thereafter, second conductive layer 119 comprising, for example, a polysilicon layer is formed over diffusion preventing layer 117 to fill contact hole 104. Second conductive layer 119 can be formed of a composite material including a polysilicon layer or a tungsten layer.

FIG. 13 shows a step of forming a third insulating layer 121. More specifically, after forming second conductive layer 119a, diffusion preventing layer 117a and refractory metal layer 111a patterned through photolithography, third insulating layer 121 for insulating the second conductive layer and any number of additional layers and structures formed by succeeding process steps are formed on the surface of the resultant structure.

After forming third insulating layer 121, natural oxide layer 108 changes into a conductive material such as $TiSi_xO_y$, by the reaction with refractory metal layer 111a during a succeeding process, e.g., a reflow process of a BPSG layer used for planarization prior to the deposition of a metal layer.

According to the present invention, an oxide layer naturally forming on the side edge of a conductive layer is changed into a conductive layer, thereby achieving the reduction of a contact resistance of a semiconductor device and the stabilization of a contact. The foregoing embodiments have been given by way of example. The present invention is not limited to these exemplary embodiments, and those of ordinary skill in the art will appreciate that multiple variations to the foregoing disclosure can be made without removing such from the scope of the claims set forth below.

What is claimed is:

1. A method of forming a side contact in a semiconductor device, comprising the steps of:

forming a first insulating layer over a substrate;

forming a first conductive layer over the first insulating layer;

forming second insulating layer over the first conductive layer;

forming a contact hole through the second insulating layer, first conductive layer, and first insulating layer to expose a portion of the substrate, wherein a side edge of the first conductive layer is exposed in the contact hole, such that a natural oxide layer forms on the side edge upon exposure of the side edge to air;

forming a refractory metal layer in the contact hole over the exposed portion of the substrate and over the natural oxide layer;

forming a second conductive layer over the refractory metal layer to fill the contact hole; and, changing the natural oxide layer into a conductive material.

2. The method of forming a side contact according to claim 1, wherein the refractory metal layer comprises a transition metal having high oxygen solubility.

3. The method of forming a side contact according to claim 1, wherein the refractory metal layer is formed of titanium.

4. The method of forming a side contact according to claim 1, wherein the step of changing the natural oxide layer into a conductive material is performed by reaction of the natural oxide layer with the refractory metal layer.

5. The method of forming a side contact according to claim 1, wherein the second conductive layer comprises a composite material including polysilicon and tungsten.

6. A method of forming a side contact in a semiconductor device comprising the steps of:

forming a first insulating layer over a substrate;

forming a first conductive layer over the first insulating layer;

forming second insulating layer over the first conductive layer;

forming a contact hole through the second insulating layer, first conductive layer, and first insulating layer to expose a portion of the substrate, wherein a side edge of the first conductive layer is exposed in the contact hole, such that a natural oxide layer forms on the side edge upon exposure of the side edge to air;

forming a refractory metal layer in the contact hole over the exposed portion of the substrate and over the natural oxide layer;

forming a diffusion inhibiting layer over the refractory metal layer;

forming a second conductive layer over the diffusion inhibiting layer to fill the contact hole; and, changing the natural oxide layer into a conductive material.

7. The method of forming a side contact according to claim 6, wherein the refractory metal layer comprises a transition metal having high oxygen solubility.

8. The method of forming a side contact according to claim 6, wherein the refractory metal layer is formed of titanium.

9. The method of forming a side contact according to claim 6, wherein the diffusion inhibiting layer comprises titanium nitride.

10. The method of forming a side contact according to claim 6, wherein the step of changing the natural oxide layer is performed by the reaction of the natural oxide layer with the refractory metal layer.

11. The method of forming a side contact according to claim 6, wherein the second conductive layer comprises a composite material including polysilicon and tungsten.

* * * * *